United States Patent
Hussain et al.

(10) Patent No.: US 11,164,982 B2
(45) Date of Patent: Nov. 2, 2021

(54) FLEXIBLE AND STRECHABLE IMAGER, METHOD OF MAKING A FLEXIBLE AND STRETCHABLE IMAGER, AND METHOD OF USING AN IMAGING DEVICE HAVING A FLEXIBLE AND STRETCHABLE IMAGER

(71) Applicant: KING ABDULLAH UNIVERSITY OF SCIENCE AND TECHNOLOGY, Thuwal (SA)

(72) Inventors: Muhammad Mustafa Hussain, Austin, TX (US); Galo Andrés Torres Sevilla, Tungurahua (EC)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 59 days.

(21) Appl. No.: 16/612,809

(22) PCT Filed: Jun. 8, 2018

(86) PCT No.: PCT/IB2018/054174
§ 371 (c)(1),
(2) Date: Nov. 12, 2019

(87) PCT Pub. No.: WO2019/012345
PCT Pub. Date: Jan. 17, 2019

(65) Prior Publication Data
US 2020/0152811 A1    May 14, 2020

Related U.S. Application Data

(60) Provisional application No. 62/532,459, filed on Jul. 14, 2017.

(51) Int. Cl.
*H01L 31/062* (2012.01)
*H01L 31/113* (2006.01)
(Continued)

(52) U.S. Cl.
CPC .. *H01L 31/03926* (2013.01); *H01L 27/14643* (2013.01); *H01L 27/14689* (2013.01); *H01L 31/1892* (2013.01)

(58) Field of Classification Search
CPC ........... H01L 31/03926; H01L 31/1892; H01L 27/14643; H01L 27/14689;
(Continued)

(56) References Cited

U.S. PATENT DOCUMENTS

2010/0224950 A1* 9/2010 Dinyari ............... B81B 7/04
257/441

FOREIGN PATENT DOCUMENTS

WO   2008030960 A2   3/2008

OTHER PUBLICATIONS

International Search Report in corresponding/related International Application No. PCT/IB2018/054174, dated Nov. 30, 2018.
(Continued)

*Primary Examiner* — Calvin Y Choi
(74) *Attorney, Agent, or Firm* — Patent Portfolio Builders PLLC

(57) ABSTRACT

A flexible and stretchable imager includes a first rigid substrate carrying at least one first photodetector, a second rigid substrate carrying at least one second photodetector, and a flexible and stretchable arm connected to the first and second rigid substrates. The first rigid substrate, the second rigid substrate, and the flexible and stretchable arm are made of a same material.

17 Claims, 10 Drawing Sheets

(51) Int. Cl.
*H01L 31/0392* (2006.01)
*H01L 27/146* (2006.01)
*H01L 31/18* (2006.01)

(58) Field of Classification Search
CPC ....... H01L 27/146–14893; H01L 25/041–043; H01L 25/047; H01L 23/4985; H01L 23/5387
USPC ........................................................ 257/292
See application file for complete search history.

(56) References Cited

OTHER PUBLICATIONS

Written Opinion of the International Searching Authority in corresponding/related International Application No. PCT/IB2018/054174, dated Nov. 30, 2018.

Afshari, H., et al., "The PANOPTIC Camera: A Plenoptic Sensor with Real-Time Omnidirectional Capability," Journal of Signal Processing Systems, Mar. 14, 2012, vol. 70, pp. 305-328, Springer.

Hung, P.J., et al., "Microfabricated Suspensions for Electrical Connections on the Tunable Elastomer Membrane," Applied Physics Letters, Dec. 13, 2004, vol. 85, No. 24, pp. 6051-6053, American Institute of Physics.

Jung, I., et al., "Dynamically Tunable Hemispherical Electronic Eye Camera System with Adjustable Zoom Capability," Proceedings of National Academy of Science, U.S.A., Feb. 1, 2011, vol. 108, No. 5, pp. 1788-1793.

Ko, H.C. et al., "A Hemispherical Electronic Eye Camera Based on Compressible Silicon Optoelectronics," Nature, Aug. 7, 2008, vol. 454, pp. 748-753, Macmillan Publishers Limited.

Li, L., et al., "Development of a 3D Artificial Compound Eye," Optics Express, Aug. 9, 2010, vol. 18, No. 17, pp. 18125-18137, OSA.

Lu, C, et al., "Mechanics of Tunable Hemispherical Electronic Eye Camera Systems that Combine Rigid Device Elements with Soft Elastomers," Journal of Applied Mechanics, Nov. 2013, vol. 80, pp. 061022-1-061022-7.

Rojas, J.P., et al., "Design and Characterization of Ultra-Stretchable Monolithic Silicon Fabric," Applied Physics Letters, Oct. 13, 2014, vol. 105, pp. 154101-1-154101-5, AIP Publishing LLC.

Song, E., et al., "Bendable Photodetector on Fibers Wrapped with Flexible Ultra-Thin Single Crystalline Silicon Nanomembranes," ACS Applied Materials Interfaces, Mar. 29, 2017, p. 12171-12175, American Chemical Societyed.

Street, R., et al., "Curved Electronic Pixel Arrays Using a Cut and Bend Approach," Journal of Applied Physics, May 21, 2009, vol. 105, p. 104504-1-104504-6, American Institute of Physics.

Yuan, H.C., et al., "Flexible Photodetectors on Plastic Substrates by Use of Printing Transferred Single-Crystal Germanium Membranes," Applied Physics Letters, Jan. 6, 2009, vol. 94, p. 013102-1-013102-3, American Institute of Physics.

\* cited by examiner

FLEXIBLE AND STRECHABLE IMAGER, METHOD OF MAKING A FLEXIBLE AND STRETCHABLE IMAGER, AND METHOD OF USING AN IMAGING DEVICE HAVING A FLEXIBLE AND STRETCHABLE IMAGER

CROSS-REFERENCE TO RELATED APPLICATIONS

This application is a U.S. National Stage Application of International Application No. PCT/IB2018/054174, filed on Jun. 8, 2018, which claims priority to U.S. Provisional Patent Application No. 62/532,459, filed on Jul. 14, 2017, entitled "360° Stretchable Monocrystalline Silicon-Based Photosensor for Digital Imaging Applications," the disclosures of which are incorporated herein by reference in their entirety.

BACKGROUND

Technical Field

Embodiments of the subject matter disclosed herein generally relate to a flexible and stretchable imager, a method of making a flexible and stretchable imager, and method of using an imaging device having a flexible and stretchable imager.

Discussion of the Background

The decreasing size of imagers (i.e., an electronic device that records an image) has expanded the applications for imagers and image capture devices containing imagers. Thus, while for many years imagers are exclusively used in handheld cameras, imagers are now present in a wide variety of devices, such as smartphones, automobiles, biomedical devices, etc. Accordingly, most research in the field of photodetection technology focuses on obtaining miniaturized devices with high responsivity, large bandwidth, low noise, and high gain. This is typically achieved using thick active layers.

Thick active layers result in rigid imagers having photodetectors arranged along a single plane, which limits the applications of these imagers. To address this limitation, research has been performed to investigate flexible and stretchable imagers in which the photodetectors of the imagers can be arranged in more than a single plane, which allows the imagers to be arranged in a variety of form factors and also improves the field of view of the imagers. One technique for producing flexible and stretchable imagers involves the use of semiconductor nanowires and nanomembranes (e.g., silicon nanowires and nanomembranes) connecting rigid substrates, each carrying an array of photodetectors. This technique, however, involves complex fabrication techniques (due to the use of different technologies to form the photodetector arrays on the rigid substrates and the semiconductor nanowires or nanomembranes), requires expensive materials to form the semiconductor nanowires or nanomembranes compared to the less expensive materials to form the photodetector arrays and rigid substrates, and requires the use of intricate micro-lenses to achieve, at best, satisfactory results.

Thus, there is a need for a flexible and stretchable imager that does not involve complex fabrication techniques, expensive materials, and intricate micro-lenses.

SUMMARY

According to an embodiment, there is a flexible and stretchable imager, which includes a first rigid substrate carrying at least one first photodetector, a second rigid substrate carrying at least one second photodetector, and a flexible and stretchable arm connected to the first and second rigid substrates. The first rigid substrate, the second rigid substrate, and the flexible and stretchable arm are made of a same material.

According to another embodiment, there is a method for producing a flexible and stretchable imager. A first and second photodetector are formed on a rigid substrate. A top portion of the substrate is patterned to form a first area surrounding the first photodetector, a second area surrounding the second photodetector, and a flexible and stretchable arm connecting the first and second areas. The patterned top portion of the substrate is released from a remainder of the substrate.

According to yet another embodiment, there is a method of using an imaging device having a flexible and stretchable imager. A point of gaze, required compression, and required image quality for one or more images are determined. The flexible and stretchable imager is supported by a carrier. A size of the carrier is adjusted based on the determined point of gaze, required compression, and required image quality for one or more images. One or more images are captured using the flexible and stretchable imager while the carrier is in its adjusted size. The one or more images are processed based on the determined point of gaze, required compression, and required image quality for one or more images.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of an imager.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1A:
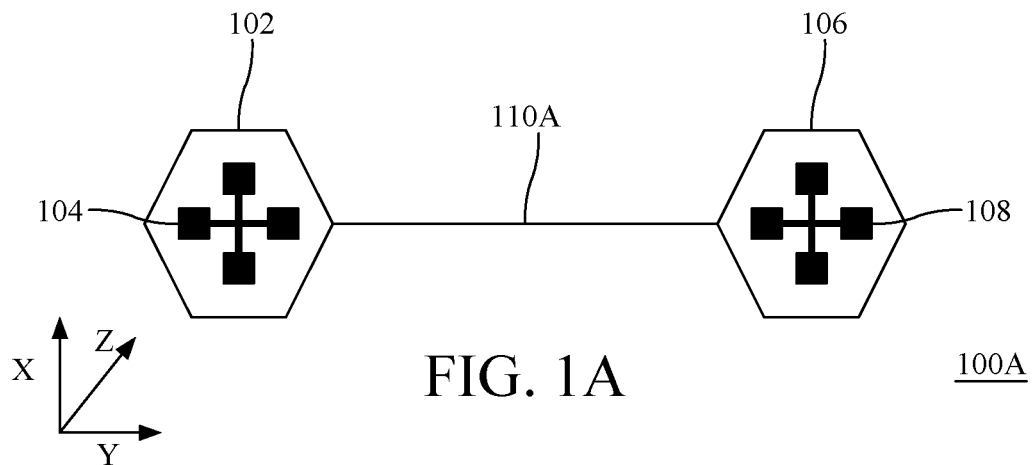
FIGS. 1A-1F are schematic diagrams of a flexible and stretchable imager according to embodiments.

Referring to FIG. 1A, a flexible and stretchable imager 100A includes a first rigid substrate 102 carrying at least one first photodetector 104 and a second rigid substrate 106 carrying at least one second photodetector 108. A flexible and stretchable arm 110A is connected to the first 102 and second 106 rigid substrates. The first rigid substrate 102, the second rigid substrate 106, and the flexible and stretchable arm 110A are made of a same material.

In one embodiment, the material of the rigid substrates 102 and 106 and the flexible and stretchable arm 110A is a doped semiconductor material, such as a doped p-type silicon material. The doping can be performed using, for example, boron to produce a boron-doped wafer. Other embodiment can employ other types doped semiconductor materials, as well as other types of doping elements. Moreover, the material of the rigid substrates 102 and 106 and the flexible and stretchable arm 110A can be a polymer.

The first 102 and second 106 rigid substrates are rigid substrates that do not flex in the Z direction or stretch along the X-Y plane, and thus the flexibility of the imager 100A is achieved by virtue of the flexible and stretchable arm 110A. Specifically, due to the relative sizes of the substrates 102 and 106 and the arm 110A in the X-Y plane results in the substrates 102 and 106 being rigid and the arm being flexible. This can hold true even when the substrates 102 and 106 are of the same thickness in the Z direction, which is perpendicular to the X and Y directions.

Figure 1B:
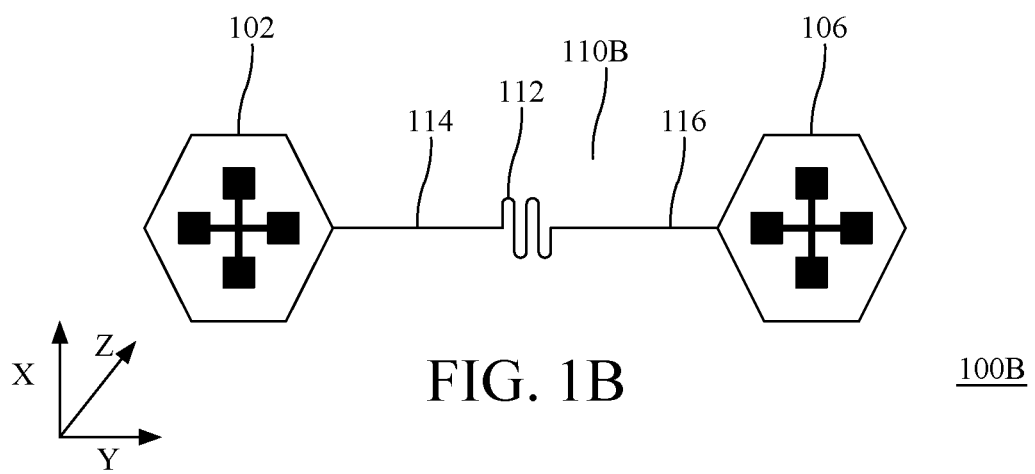

The stretchability of the arm 110A is achieved by providing the arm 110A with at least one stretchable portion, various embodiments of which are illustrated in FIGS. 1B-1F. As illustrated in FIG. 1B, an imager 100B includes a flexible and stretchable arm 110B having a wave-shaped stretchable portion 112, which can be stretched in a direction Y between the first 102 and second 106 rigid substrates. The wave-shaped stretchable portion 112 is both flexible (i.e., can be flexed in the Z direction) and stretchable (i.e., can be stretched along the X-Y plane). Specifically, stretching the flexible and stretchable arm 110B by increasing a distance between the first 102 and second 106 rigid substrates in the X-Y plane causes the wave-shaped stretchable portion 112 to elongate. The flexible and stretchable arm 110B can also have two non-stretchable portions 114 and 116 interposed between the stretchable portion 112 and the first 102 and second rigid substrates 104, respectively.

Figure 1C:
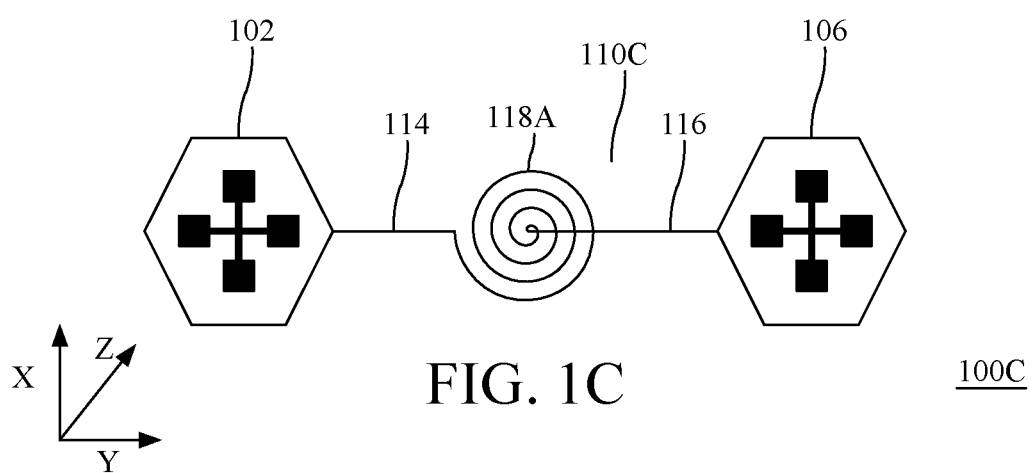

In FIG. 1C, the imager 100C includes a flexible and stretchable arm 110C having at least one spiral-shaped stretchable portion 118A, which can be stretched in a direction Y between the first 102 and second 106 rigid substrates. The spiral-shaped stretchable portion can have a width of, for example, 10 μm. The spiral stretchable portion 118A is both flexible (i.e., can be flexed in the Z direction) and stretchable (i.e., can be stretched along the X-Y plane). Specifically, stretching the flexible and stretchable arm 110C by increasing a distance between the first 102 and second 106 rigid substrates in the X-Y plane causes the spiral-shaped stretchable portion 118A to uncoil and elongate. The flexible and stretchable arm 110C can also have two non-stretchable portions 114 and 116 interposed between the stretchable portion 112 and the first 102 and second rigid substrates 104, respectively.

Figure 1D:
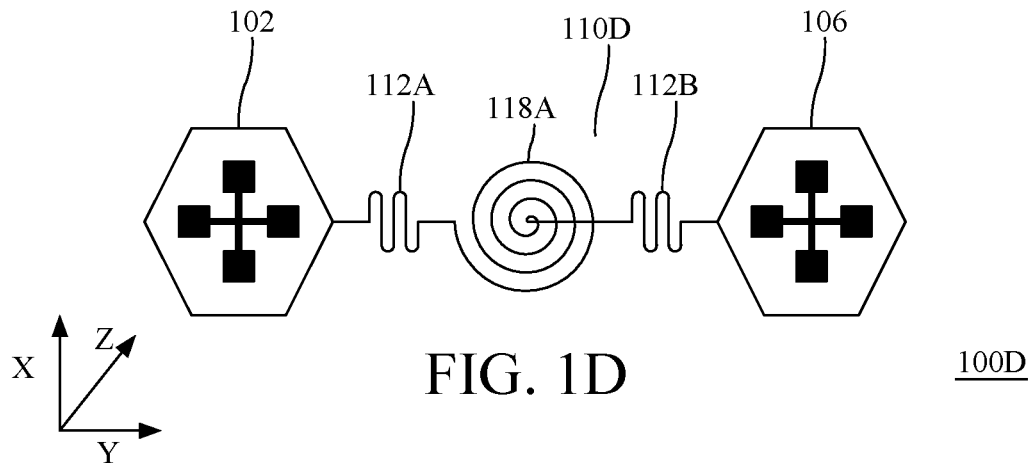

In FIG. 1D, the imager 100D includes a flexible and stretchable arm 110D having at least one spiral-shaped stretchable portion 118A and two wave-shaped stretchable portions 112A and 112B, all of which can be stretched in a direction Y between the first 102 and second 106 rigid substrates. The spiral stretchable portion 118A and two wave-shaped stretchable portions 112A and 112B are both flexible (i.e., can be flexed in the Z direction) and stretchable (i.e., can be stretched along the X-Y plane). Specifically, stretching the flexible and stretchable arm 110D by increasing a distance between the first 102 and second 106 rigid substrates in the X-Y plane causes the spiral-shaped stretchable portion 112 to uncoil and elongate and the wave-shaped stretchable portion 112 to elongate. The flexible and stretchable arm 110D can also have non-stretchable portions (not labeled for purposes of clarity) interposed between the rigid substrate 102 and the wave-shaped stretchable portion 112A, between the wave-shaped stretchable portion 112A and the spiral-shaped stretchable portion 118A, between the spiral-shaped stretchable portion 118A and the wave-shaped stretchable portion 112B, and between the wave-shaped stretchable portion 112B and the second rigid substrate 106.

Figure 1E:
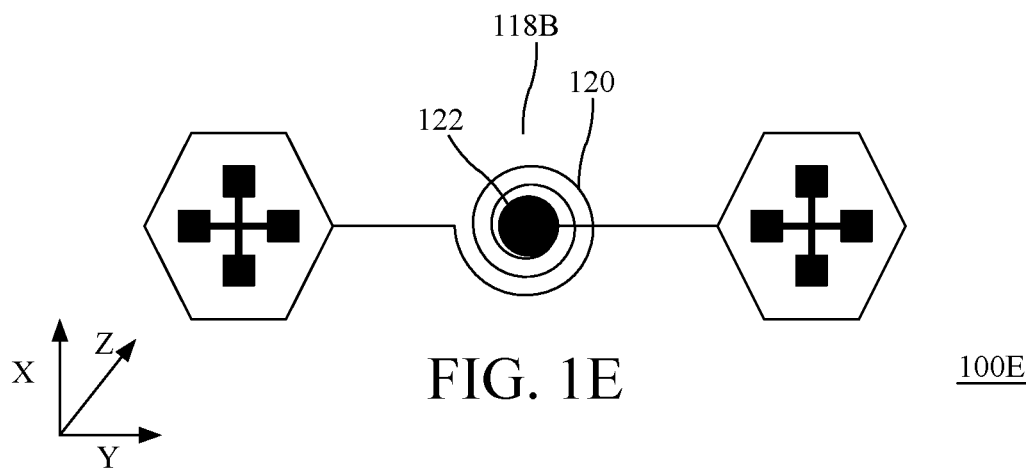
Figure 1F:
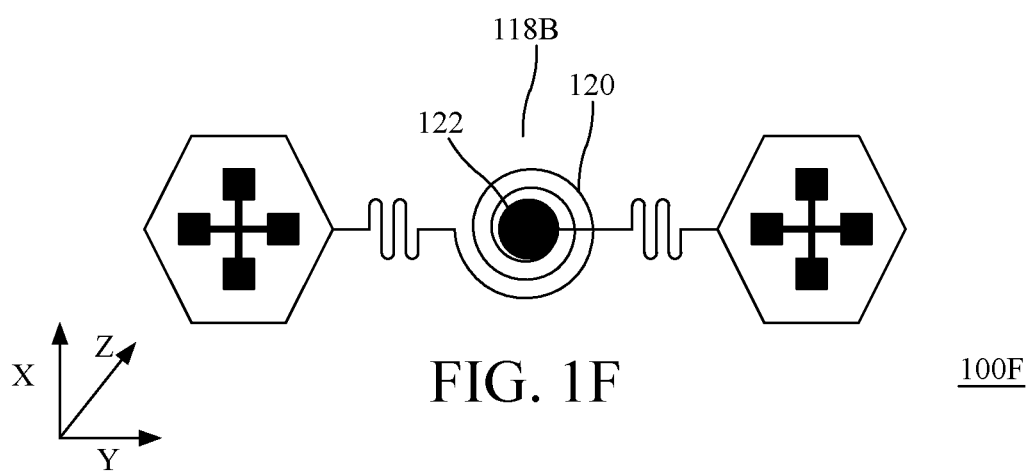
Figure 2:
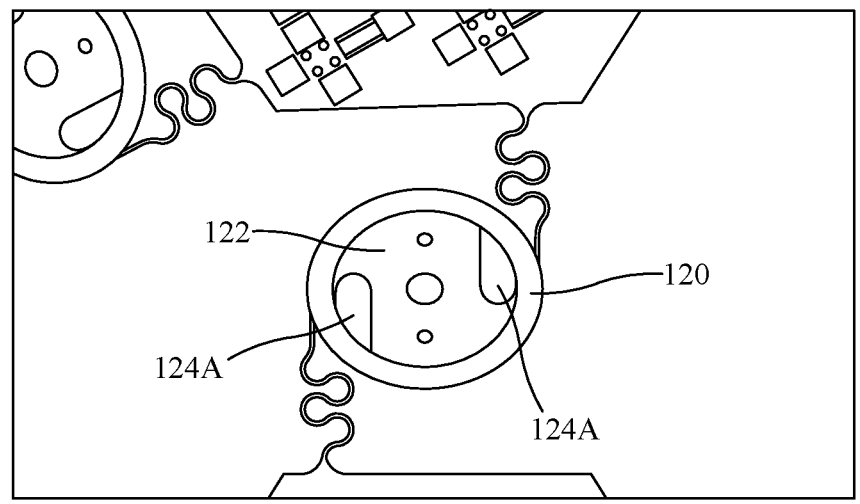
FIG. 2 is a schematic diagram of a flexible and stretchable imager having notches in a spiral portion according to an embodiment.

FIGS. 1E and 1F are similar to the figures above except that the spiral-shaped portion 118B includes a spiral portion 120 that can elongate and a center portion 122 that does not elongate. In order to assist with the creation of the spiral portion 120, notches 124A and 124B can be provided in the center portion 120, an example of which is illustrated in FIG. 2.

Figure 3:
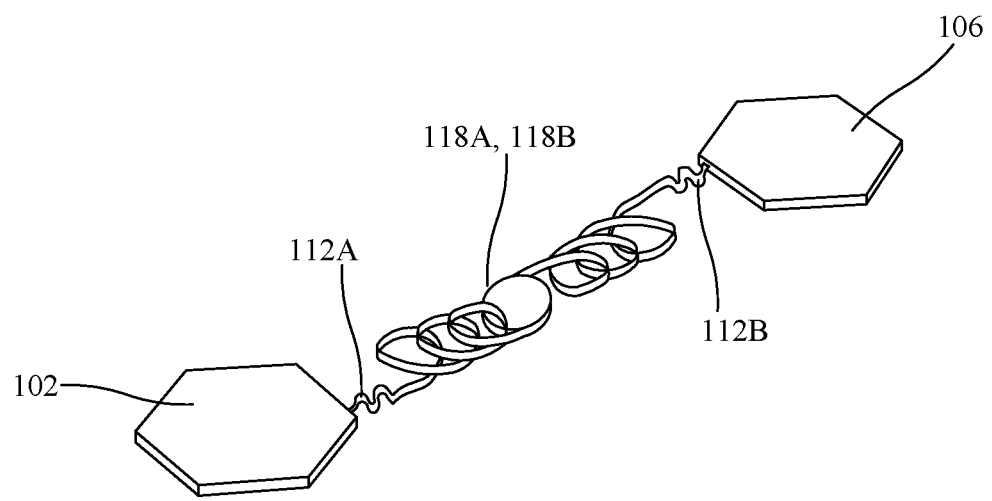
FIG. 3 is a schematic diagram of a flexible and stretchable imager being stretched according to an embodiment.

The stretchability of the imager 100D or 100F is illustrated in FIG. 3. As illustrated, the spiral-shaped portion 118A and 118B elongates by uncoiling and the wave-shaped portions 112A and 112B elongate by extension in a direction between the first 102 and second 106 rigid substrates. Testing demonstrated a maximum flexibility of 700%, with the distance between the two rigid substrates 102 and 106 expanding from 2.2 mm to 15.4 mm. Testing using simultaneous in-plane (along x-axis) and out-of-plane (z-axis) displacements of 1 mm showed the maximum stress increased from 0.3 GPa to 0.6 GPa and strain increased from 0.1 to 0.2, respectively. Although the value of stress and strain increased due to out-of-plane deformation, all the mechanical stress are still concentrated within the spirals on the arms, while the rigid substrates are kept in stress-free state.

Figure 4:
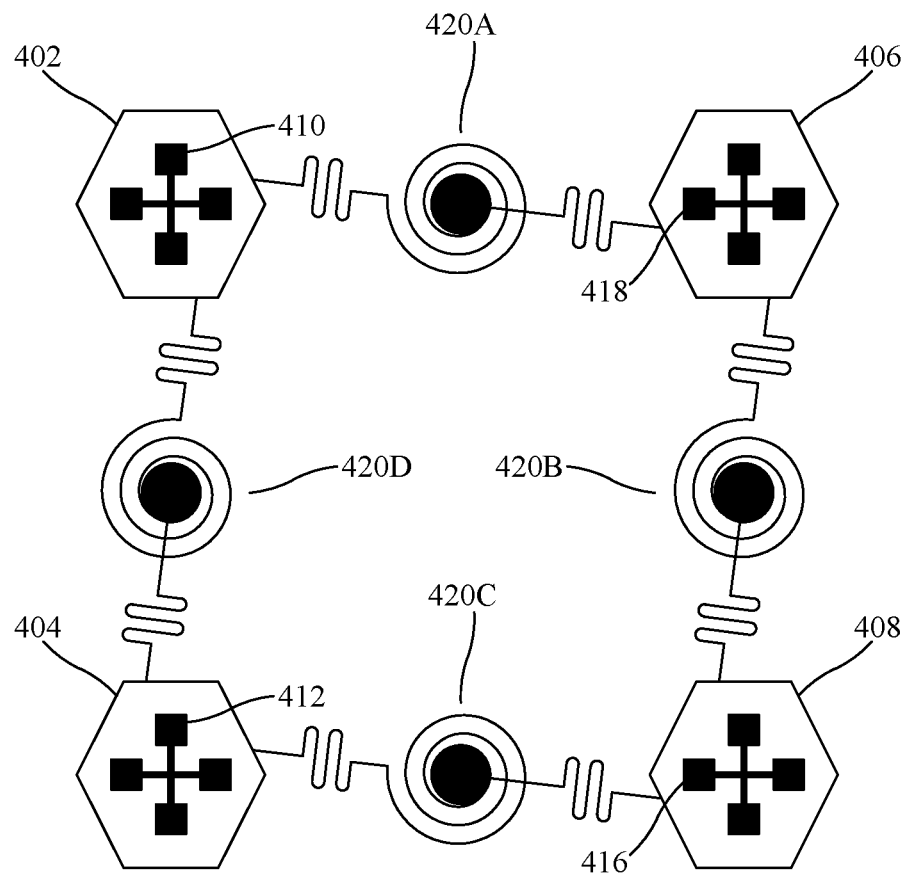
FIG. 4 is a schematic diagram of a flexible and stretchable imager having more than two rigid substrates according to an embodiment.

For ease of explanation, and not limitation, the embodiments described above involved imagers with two rigid substrates 102 and 106. The imager can include more than two rigid substrates, an example of which is illustrated in FIG. 4, which illustrates four rigid substrates 402, 404, 406, 408, each carrying an associated photodetector 410, 414, 416, and 418. As illustrated in the figure, the flexible and stretchable arms 420A-420D are connected to the substrates near, but not at the corner of the rigid substrates 402-408 and at opposite ends of the sides of the respective rigid substrates 402-408. Connecting the flexible and stretchable arms 420A-420D to the substrates near, but not at the corner of the rigid substrates 402-408 provides better structural integrity compared to connecting at the corners themselves and connecting them at opposite ends of the sides of the respective rigid substrates 402-408 increases the flexibility and stretchability of the overall imager.

Figure 5:
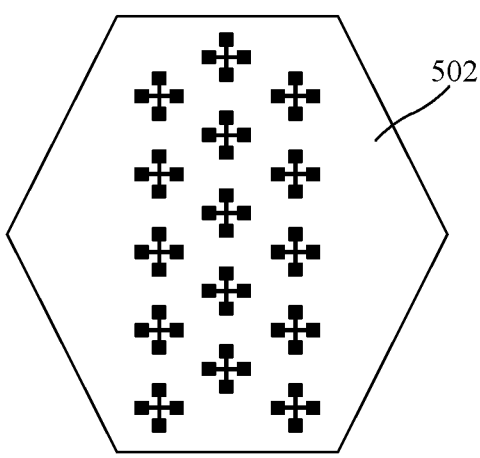
FIG. 5 is a schematic diagram of a rigid substrate carrying a photodetector array according to an embodiment.

For ease of illustration, in the embodiments described above, the rigid substrates are illustrated as each carrying a single photodetector. However, the rigid substrates can carry an array of photodetectors 502, as illustrated in FIG. 5.

Figure 6:
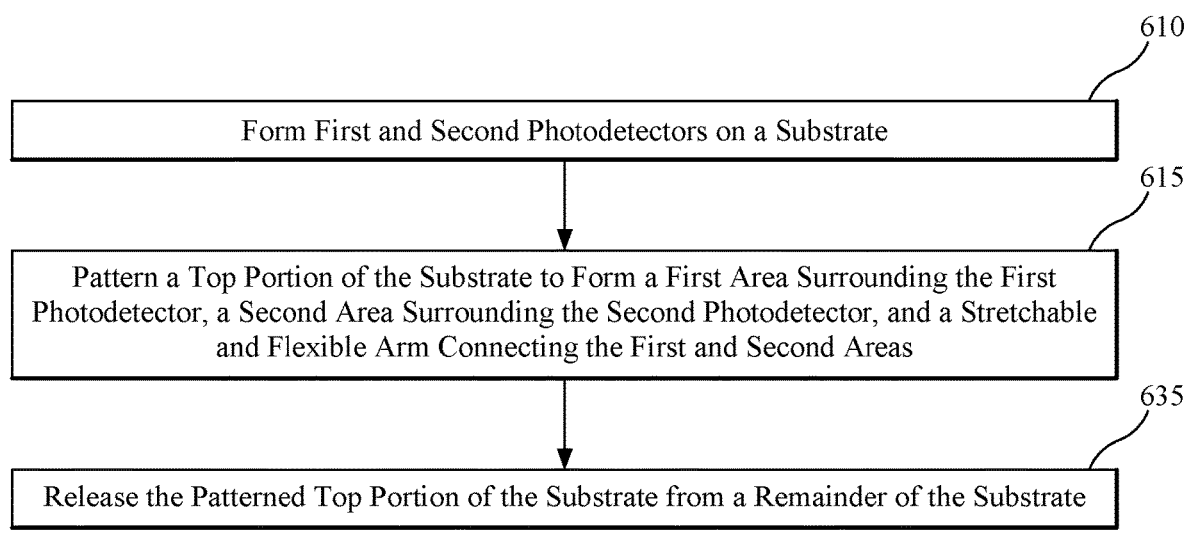
FIGS. 6 and 7 are flowcharts of methods for making a flexible and stretchable imager according to embodiments.

FIG. 6 is a flowchart of a method for making a flexible and stretchable imager according to an embodiment. Initially, first 104 and second 108 photodetectors are formed on a substrate (step 610). A top portion of the substrate is patterned to form a first area surrounding the first photodetector 104, a second area surrounding the second photodetector 108, and a flexible and stretchable arm 110A-110F connecting the first and second areas (step 615). The patterned top portion of the substrate is then released from the remainder of the substrate (step 635). The remainder of the substrate can be referred to as the bulk substrate.

Figure 7:
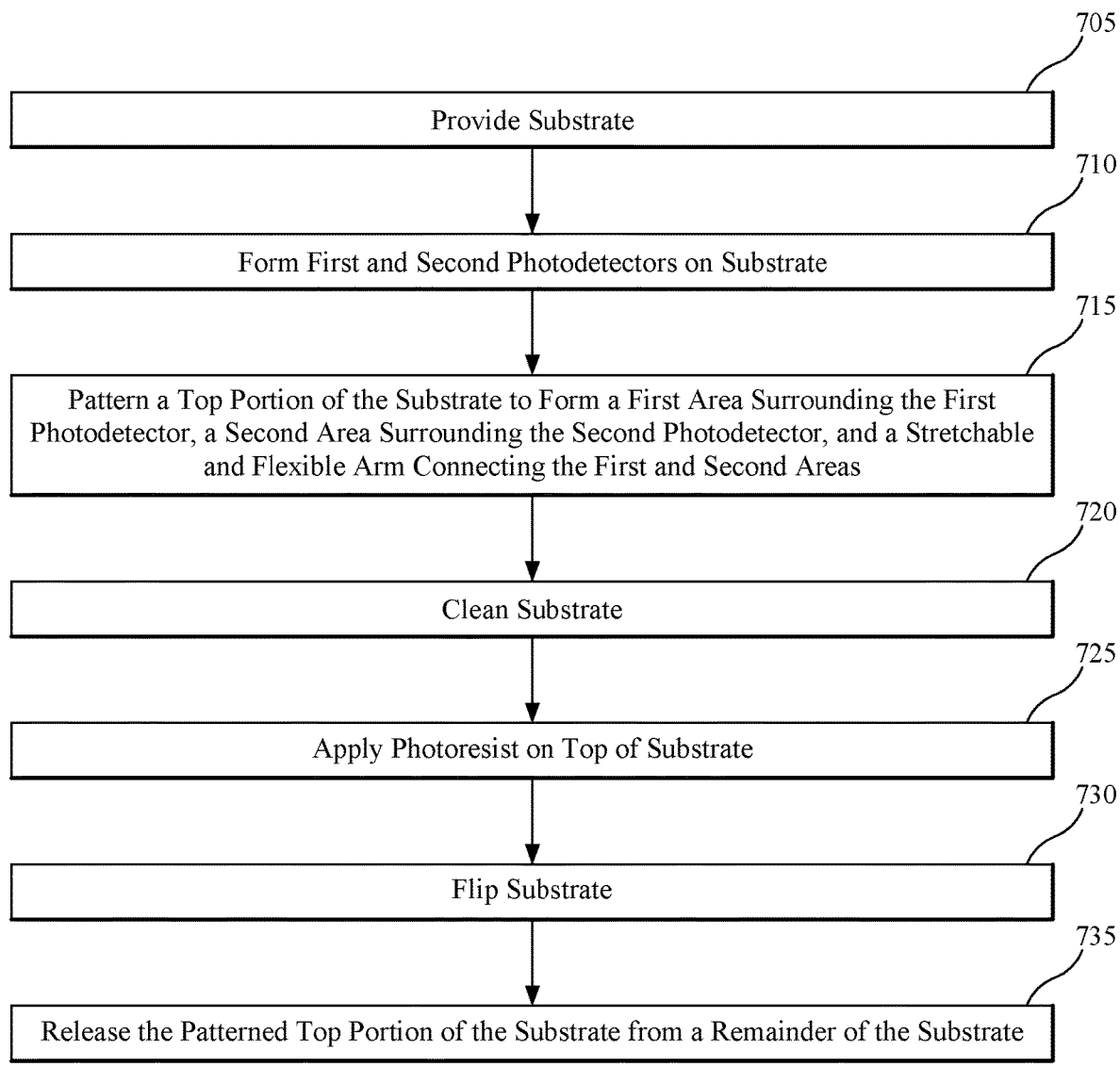

FIG. 7 is another flowchart of a method for making a flexible and stretchable imager, which will be described in connection with the schematic diagrams in FIGS. 8A-8F.

Figure 8A:
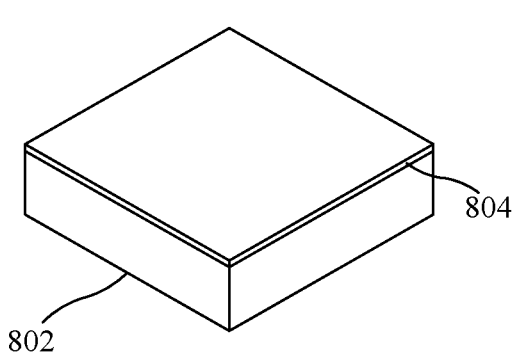
FIGS. 8A-8F are schematic diagrams of a method of making a flexible and stretchable according to an embodiment.
Figure 8B:
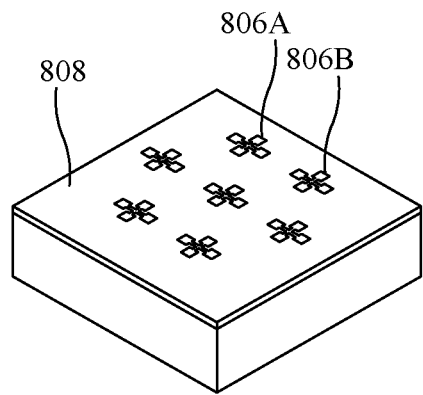

Initially, a substrate is provided (step 705). The substrate can be, for example a doped semiconductor wafer, such as a p-doped silicon (100) wafer with a resistivity of 0.1 Ωcm. Next, at least first and second photodetectors are formed on the substrate (step 710). The details of the formation of the photodetectors are addressed below in connection with FIG. 9, which begins growing an oxide layer on top of the substrate. Thus, FIG. 8A illustrates the substrate 802 having oxide layer 804, and FIG. 8B illustrates at least first 806A and second photodetectors 806B on a top portion 808 of the substrate, which is below the oxide layer 804.

Figure 8C:
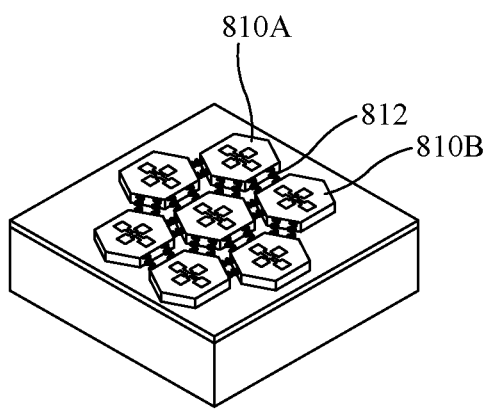

The top portion of the substrate 808 is patterned to form a first area 810A surrounding the first photodetector 806A, a second area 810B surrounding the second photodetector 806B, and a flexible and stretchable arm 812 connecting the first 810A and second 810B areas (step 715 and FIG. 8C). The patterning can be performed by applying a photoresist, for example PR AZ ECI 3027 from MicroChemicals GmbH, performing contact photolithography and deep-reactive-ion-etching (DRIE).

The substrate is then cleaned (step 720) and a photoresist is applied on top of the substrate 802 (step 725). The cleaning can involve, for example isopropanol (IPA) and plasma ashing, and the photo resist can be the same one used for the patterning.

Figure 8D:
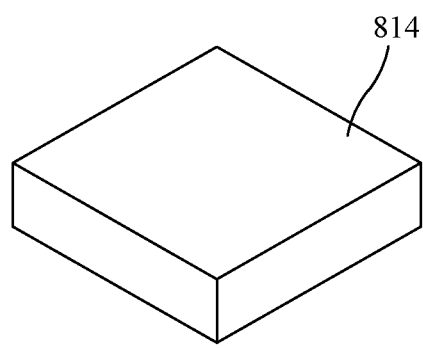
Figure 8E:
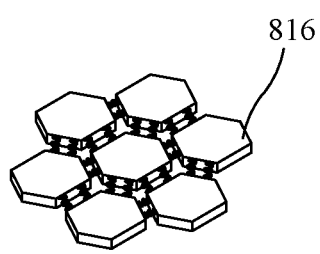
Figure 8F:
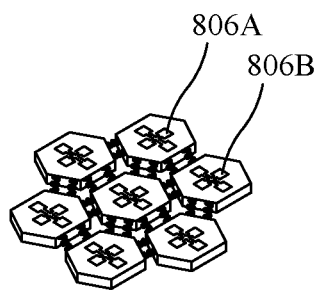

As illustrated in FIG. 8D, the substrate 802 is flipped so that the bottom 814 is facing upwards (step 730), and then as illustrated in FIG. 8E, the patterned top portion of the substrate 816 is released from the remainder of the substrate (step 735). The release can be achieved by, for example, loading the flipped substrate 802 into a deep-reactive-ion-etching chamber and etching the substrate 802 back until the complete bulk substrate is removed and only the freestanding structures (i.e., the rigid substrates 810A and 810B and the flexible and stretchable arms 812) remain. The patterned top portion of the substrate 816 can then be flipped so that the first and second photodetectors are facing up, which is illustrated in FIG. 8F.

It should be recognized that the method of making the flexible and stretchable imager can involve additional steps. For example, the method can involve creating vias in the top portion of the substrate 808 so that the processing electronics can access the photodetectors 806A and 806B from the backside of the device, which avoids interference with the photodetectors ability to collect light. Additionally, the photodetectors 806A and 806B can be formed so that a portion of the photodetector is accessible on a back side of the rigid substrates for an electrical connection to image processing electronics.

Figure 9:
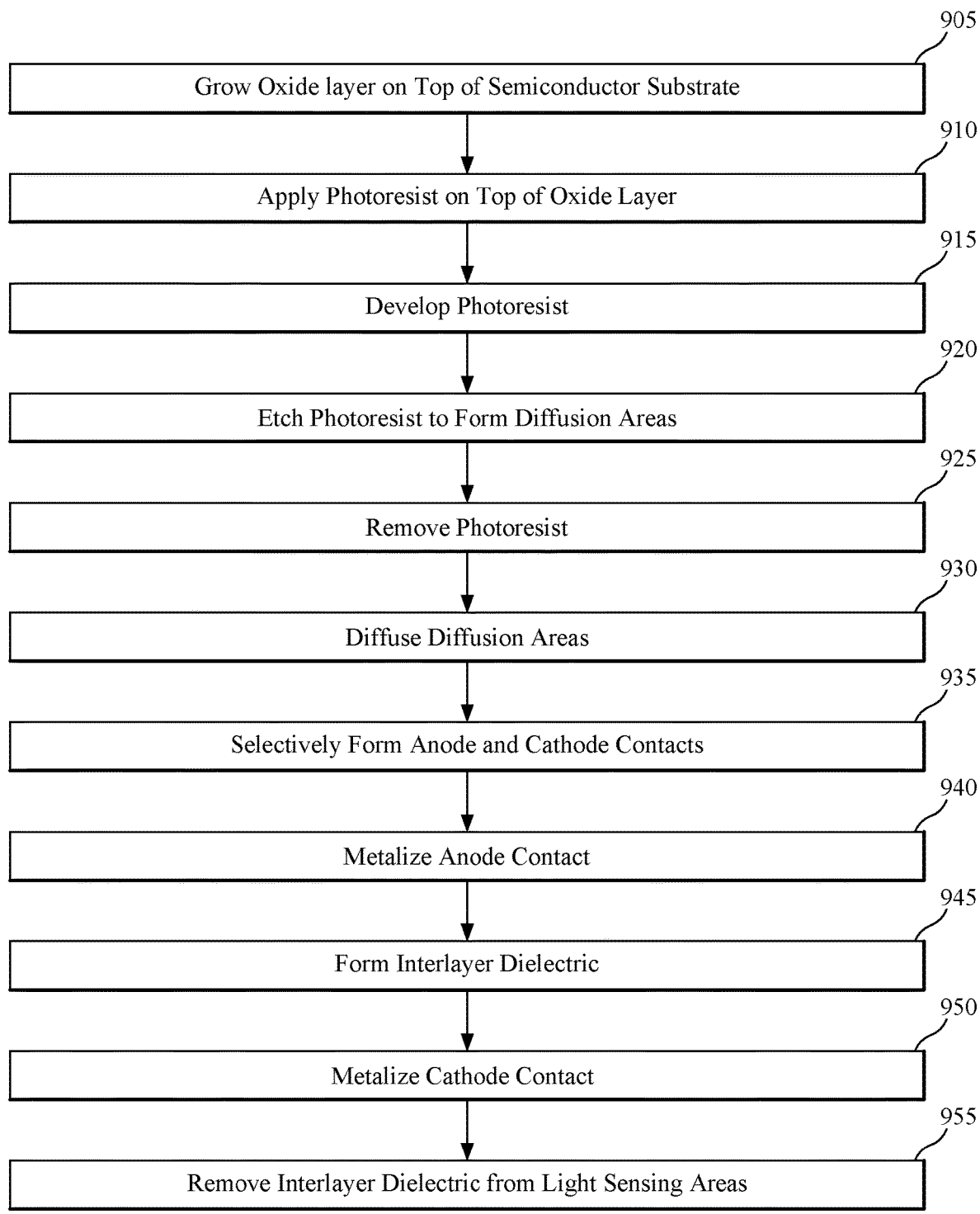
FIG. 9 is a flowchart of a method of making a photodetector according to an embodiment.

Turning now to FIG. 9, the method of making the photodetectors involves growing an oxide layer on top of the semiconductor substrate (step 905), which can be achieved, for example by thermally growing 300 nm of $SiO_2$ using a dry-wet-dry method for 20 minutes. A photoresist is then applied on top of the oxide layer (step 910), which can involve, for example, performing photolithography using an ECI 3027 (from MicroChemicals GmbH) positive photoresist having a thickness of 4 μm and an exposure dose of 200 mJ/cm$^2$. The photoresist is then developed (step 915).

The oxide layer is etched to form diffusion areas (step 920). This can be achieved, for example, using a combination of dry etch in a reactive-ion-etching (RIE) and wet etch with a wet hood using buffered-oxide-etching (BOE). The photoresist is then removed, for example using acetone and plasma ashing (step 925). The diffusion areas are then diffused (step 930), which can be achieved, for example, using solid source diffusion at 900° C. for 1 hour to achieved a concentration of $10^{19}$ atoms/cm$^3$ of phosphorous. In one embodiment, each p-n junction photodiode is 25 μm×25 μm.

The anode and cathode areas are then selectively formed to create ohmic contacts and reduce the contact resistance between the semiconductor and the contact metal (step 935). This can be achieved, for example, by selectively forming nickel-silicide using photolithography and nickel lift-off at 450° C. for five minutes. The anode contact is metalized (step 940), for example by depositing aluminum and using a patterned lift-off technique. A dielectric interlayer is then formed (step 945). This can involve, for example, depositing 200 nm $SiO_2$ and then patterning in the cathode area using lithography and dry reactive-ion-etching. The cathode contact is then metalized (step 950), for example, by depositing aluminum and using a patterned lift-off technique. Finally, the dielectric interlayer is removed from the light sensing areas (step 955).

Testing the sensing ability of an imager produced using the methods above demonstrated good results. One test involved flooding the imager with white (800 μW/cm$^2$) and RGB ($\lambda_R$=650 nm, $\lambda_G$=520 nm, and $\lambda_B$=470 nm) (total=1000 μW/cm$^2$) light without any focal mechanism. This test provides allows a better understanding about the behavior of the photodiodes under direct illumination with multiple wavelengths of light. The saturation and dark current under a 1 V bias was found to be 0.121 μA and 5.4 nA for a 625 μm$^2$ photodiode. The rise and fall times of the photodetectors were measured under a 1 V bias. The rise time ($t_{rise}$) was calculated by measuring the time necessary for the current to increase from 10% to 90% of its saturation value, while the fall time ($t_{fall}$) was measured as the time necessary for the current to decrease from 90% to 10% of the saturation current. The values for rise and fall times were found to be $t_{rise}$=0.52 msec and $t_{fall}$=0.51 msec. The symmetry between the fall and rise times of the devices shows excellent photoresponsivity and dynamic response.

A test of the sensitivity of the photodiodes under illumination with different wavelengths was also performed by mounting RGB light bursts on top of a constant white light source with the following characteristics: i) white light intensity=600 μW/cm$^2$, ii) consecutive red-green-blue light bursts of 1 msec and an intensity of 400 μW/cm$^2$. A similar electrical response (saturation current=0.171 μA) was obtained from the photodiodes for each of the RGB light bursts, which demonstrates the advantage of the photodetectors to produce multiband light sensing and imaging.

The intensity of a 10×10 matrix of the photodiodes was tested using a grayscale image produced by the matrix. The grayscale image exhibited uniform response under flood illumination and showed a maximum deviation of 10% from the median intensity value. The grayscale image can be acquired from the photodiodes using an algorithm based on the following equation:

$$GS_{pixel} = \left(\frac{I_{pixel}}{I_{sat}} \times 256\right)^2$$

Where $I_{pixel}$ is the output current of each pixel and $I_{sat}$ is the saturation current of the photodetectors.

Further improvements can be achieved by creating blocking diodes that prevent crosstalk between adjacent sensors and that eliminate parasitic currents in the bulk substrate. Because the disclosed imager is produced using complementary-metal-oxide semiconductor (CMOS) technology, creating the blocking diodes can easily be incorporated into the methods described above. Further, producing the imager using CMOS technology simplifies production and reduces production costs compared to other types of technologies, such as those involving organic materials.

The compatibility of the fabricated photodetectors for use in a flexible and stretchable implementation was also tested by flexing and stretching the imager while capturing images. The results show no change in the electrical characteristics of the photodiodes. Although the complete imager was subject to mechanical deformation due to applied strain at different bending radii, localized stress in the rigid substrates carrying the photodiodes was found to be negligible and most of the mechanical stress was concentrated in the flexible and stretchable arms.

As noted above, the first and second rigid substrates and the flexible and stretchable arm can be made of a polymer. In this case, the methods described above for producing such a flexible and stretchable imager can be replaced by using three-dimensional printing of the first and second rigid substrates and the flexible and stretchable arm and then externally fabricated photodetectors can be applied to the first and second rigid substrates using, for example, transfer printing.

Figure 10:
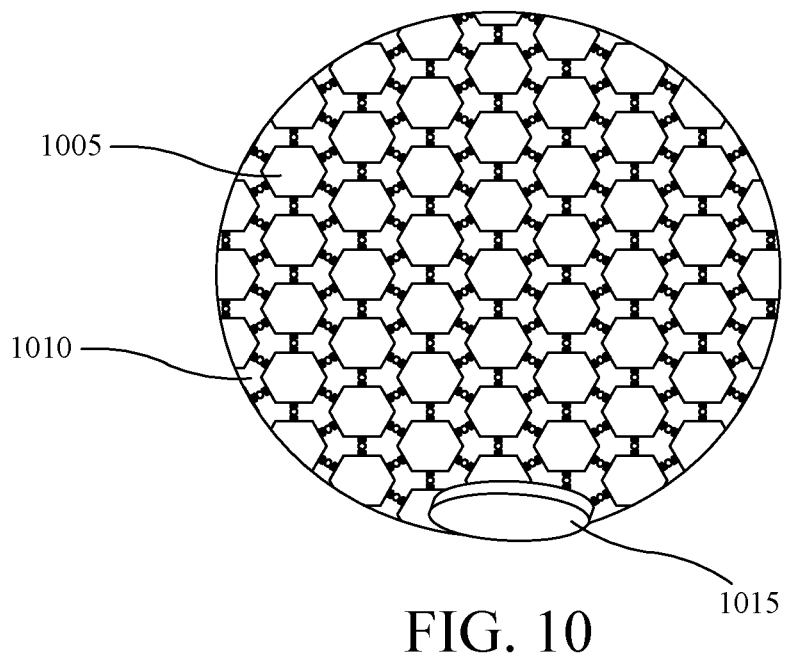
FIG. 10 is a schematic diagram of an imaging device that includes a flexible and stretchable imager according to an embodiment.

The flexibility and stretchability of the disclosed imager provides for a wide range of applications, such as a 360-degree imager, an example of which is illustrated in FIG. 10. As illustrated, the imager 1005, including the rigid substrates carrying the photodetectors and connected by the arms, can be arranged on a carrier 1010, which in this case is a sphere. The imager 1005 can be connected to itself around the carrier 1010 to avoid securing the imager 1005 using an adhesive, which would complicate the installation of the imager 1005 due to electrical connections on the back side of the rigid substrates. Additionally, a spherical lens can be arranged around the combination of the imager 1005 and carrier 1010 to assist in focusing of the imager 1005.

Additional functionality can be achieved when the carrier 1010 can have its shape adjusted. For example, carrier 1010 can include a pneumatic inlet 1015 that can be used to supply and remove fluid (e.g., air) from inside of the carrier 1010, and thus changing the shape of the carrier 1010. This allows imager to take foveated images, which is a space variant image. Specifically, depending upon a location of a photodetector (or photodetector array) relative to a point of gaze (i.e., a point of focus), the photodetector (or photodetector array) will capture a different resolution image. Specifically, the closer the photodetector (or photodetector array) is to the point of gaze results in a higher resolution captured image and the further the photodetector (or photodetector array) is from the point of gaze results in lower resolution images. This allows compactly encoded images due to the high-frequency information repetition in the peripheral regions of the images, which can remove or reduce the redundancy of this information through efficient compression. In this case, a sharper contrast in the point of gaze and a variable contrast in the image further from the point of gaze can substantially reduce the displayed information. This reduces processing time for the images captured by the photodetectors (or photodetector arrays), making the imager particularly useful in applications in which real-time processing is important. For example, foveated encoding can be employed to produce rapid previews for applications involving decision-making algorithms requiring a constant stream of data with minimal delays.

An imager configured as illustrated in FIG. 10 was tested using a 5 cm focal distance lens to test the affinity of the fabricated photodetectors with the stretchable imager. The photodiodes were placed in an initial planar configuration and a simple image was shined from the top with a distance from the platform of 6 cm while the lens was kept at a constant distance of 5 cm. Characterization of the fabricated photodetectors in stretched state was performed by changing the distance of the focal lens to 6 cm (unfocused) from the stretchable platform and then the carrier 1010 was used to lift partial areas of the imager to achieve a distance from the lens of 5 cm (focused). In this stretched state, the rigid substrates form a truncated hexagonal pyramid (frustum).

An image captured by scanning the photodetector array at two different focus levels showed the elevated area of the imager having an enhanced contrast due to the change in focus with respect of the lens. Also, by scanning finer (smaller footprint) and denser photodiodes in the point of gaze and coarse (bigger footprint) photodetectors in the peripheral areas, aberrated or blurred zones can be produced in the resultant image. Thus, foveated images can be produced without the need of special hardware or image processing. Equivalent imaging modes are almost impossible to realize using planar photodetector technologies even with sophisticated lenses, mirrors, and their combination due to the lack of multifocal points in bulk sensors.

In foveated images, the difference between the focused and out-of-focus currents, as well as the difference of scanned diodes in the focal point and its peripherals, determine the level of compression that can be achieved with the imaging system. The disclosed imager obtained a ratio ($I_{focused}/I_{unfocused}$) of 1.3, and 60% of the scanned photodetectors are in the focal point while the remaining 40% of the photodetectors cover the peripheral area of the resultant image, which provides the imager the ability to achieve compact imaging by taking the advantage of its optimized ordering of visual information in terms of perceptual importance. In space variant-imaging systems one of the most important characteristics is the determination of foveation points. In the disclosed imager, the points can be statically selected. However, depending on the application, the selection of photodetectors can be performed either interactively or automatically based on simple pneumatic or mechanical actuators and a focus feedback.

One of the main attributes provided by the flexible and stretchable imager is the advantage to produce multiple modes of operation depending on the configuration. In one case, detectors can be positioned in plane to produce either multiple (foveated) or static resolution images (as in commercial imaging systems) depending on the point of gaze, and required compression and image quality. On the other hand, a spherical or tubular configuration can be taken advantage of to produce omnidirectional reconstruction where full 360° in the x-y-z axis images are captured and displayed. The mechanical properties of the disclosed imager ensure overall reconstruction of omnidirectional imaging can be performed by a single integrated sensor. Accordingly, each rigid substrate carrying a photodetector (or photodetector array) contributes a single or an array of pixels of different regions of the resultant image.

Figure 11:
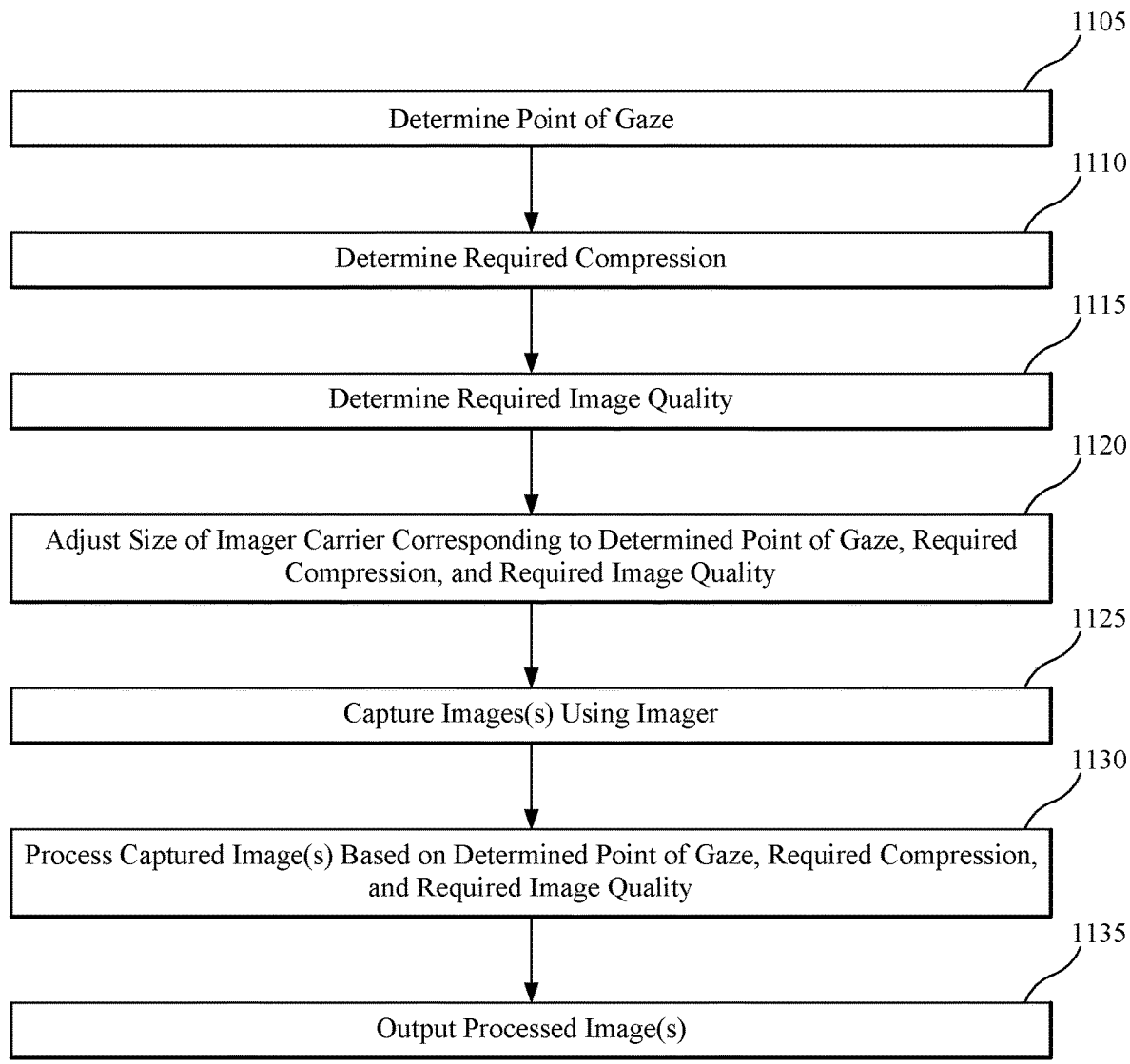
FIG. 11 is a flowchart of a method of using an imaging device that includes a flexible and stretchable imager according to an embodiment.

An exemplary use of the imager 1005 arranged on a carrier 1010 will now be described in connection with the flowchart of FIG. 11. Initially, the point of gaze (step 1105), required compression (step 1110), and required image quality (step 1115) are determined. Next, a size of the imager carrier, which in this example is carrier 1010, is adjusted corresponding to the determined point of gaze, required compression, and required image quality (step 1120). In the device illustrated in FIG. 10, this involves adjusting the internal pressure of the carrier 1010 via pneumatic inlet 1015. The image is then captured using the imager (step 1125), which will involve captured imagers corresponding to each photodetector (or each photodetector array). The captured images are then processed based on the determined point of gaze, required compression, and required image quality (step 1130). The processed image can then be output (step 1135), for example on a display.

Figure 12:
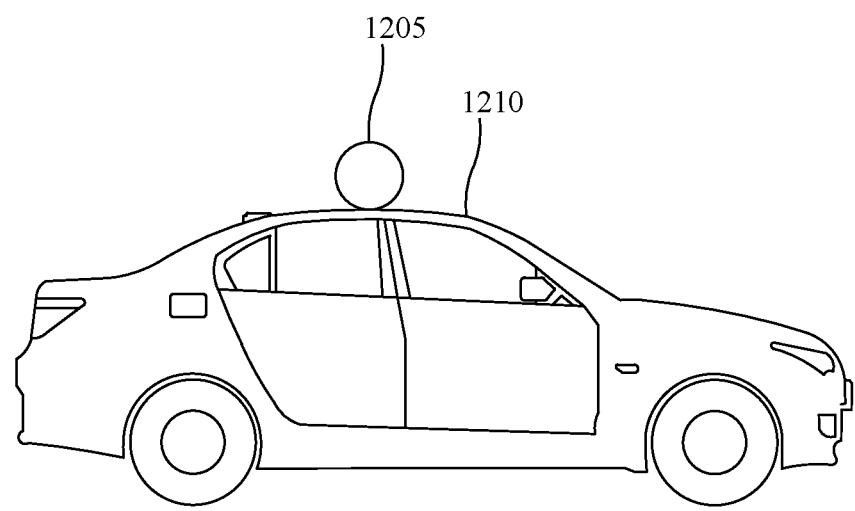
FIG. 12 is a schematic diagram of an implementation of an imaging device that includes a flexible and stretchable imager according to an embodiment.

One particularly advantageous application of the 360-degree imager is as part of a vehicle, an example of which is illustrated in FIG. 12. Specifically, the 360-degree imager 1205 can be attached to, for example, an automobile 1210 to capture a 360-degree image. Thus, the 360-degree imager 1205 can provide a "birds-eye view" that is becoming more common in automobiles, while reducing the processing load by using foveation. Further, the 360-degree imager can also provide other views, such as acting as a back-up camera or a blind-spot camera. Additionally, the 360-degree imager can be used to support a self-driving vehicle. Automobiles are just one type of vehicle the disclosed flexible and stretchable imager can be employed, others include boats, planes, helicopters, unmanned aerial vehicles, etc.

Although an embodiment has been described in connection with a 360-degree imagers, the disclosed imager need not provide a 360-degree image. For example, the disclosed flexible and stretchable imager can be arranged on a rear of the vehicle as a back-up camera, on the side of the vehicle as a blind-spot camera, etc. Further, the disclosed flexible and stretchable imager can be used in many more applications besides vehicle-based applications, such as part of a medical device, a smartphone, a virtual reality (VR) device, an augmented reality (AR) device, etc.

Although the embodiments above have been described with the rigid substrates being hexagonal shaped, the rigid substrates can have any shape, including circular, square, rectangular, octagonal, etc. However, it was found that the hexagonal shape optimizes the overall flexibility and stretchability of the imager. Further, the rigid substrates need not be the same size, and thus a flexible and stretchable imager can include different shaped rigid substrates having different sizes, the same shaped rigid substrates having the same size, and/or different shaped rigid substrates having the same size. Similarly, the length and configuration of the flexible and stretchable arms need not be the same in a flexible and stretchable imager. Thus, some arms can include only wave-shaped stretchable portions, while others include both the wave-shaped and spiral-shaped stretchable portions, only spiral-shaped stretchable portions, and/or multiple wave-shaped stretchable portions.

The disclosed embodiments provide a flexible and stretchable imager. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A flexible and stretchable imager, comprising:
   a first rigid substrate carrying at least one first photodetector;
   a second rigid substrate carrying at least one second photodetector; and
   a flexible and stretchable arm connected to the first and second rigid substrates,
   wherein the first rigid substrate, the second rigid substrate, and the flexible and stretchable arm are made of a same material, and
   wherein the flexible and stretchable arm includes a non-stretchable portion that does not elongate and a spiral stretchable portion that elongates, the spiral stretchable portion being attached to the non-stretchable portion and encircling the non-stretchable portion.

2. The flexible and stretchable imager of claim 1, wherein the spiral stretchable portion of the flexible and stretchable arm has a wave shape that stretches along a direction between the first and second rigid substrates.

3. The flexible and stretchable imager of claim 1, wherein a portion of the flexible and stretchable arm is wound in a spiral.

4. The flexible and stretchable imager of claim 3, wherein the spiral is stretchable by uncoiling portions of the spiral along a direction between the first and second rigid substrates.

5. The flexible and stretchable imager of claim 4, wherein a portion of the flexible and stretchable arm between the spiral and one of the first and second rigid substrates is a stretchable portion.

6. The flexible and stretchable imager of claim 5, wherein the stretchable portion of the flexible and stretchable arm has a wave shape that stretches along a direction between the first and second rigid substrates.

7. The flexible and stretchable imager of claim 1, wherein the material of the first rigid substrate, the second rigid substrate, and the flexible and stretchable arm is an inorganic material.

8. The flexible and stretchable imager of claim 7, wherein the inorganic material is doped silicon.

9. The flexible and stretchable image of claim 1, wherein the at least one first photodetector and the at least one second photodetector each comprise a corresponding array of photodetectors.

10. A method for producing a flexible and stretchable imager, the method comprising:
forming a first and second photodetector on a rigid substrate;
patterning a top portion of the substrate to form a first area surrounding the first photodetector, a second area surrounding the second photodetector, and a flexible and stretchable arm connecting the first and second areas; and
releasing the patterned top portion of the substrate from a remainder of the substrate,
wherein the flexible and stretchable arm includes a non-stretchable portion that does not elongate and a spiral stretchable portion that elongates, the spiral stretchable portion being attached to the non-stretchable portion and encircling the non-stretchable portion.

11. The method of claim 10, wherein the flexible and stretchable imager is produced using a complimentary metal-oxide-semiconductor (CMOS) process.

12. The method of claim 10, wherein the step of forming the first and second photodetectors on the substrate comprises forming a plurality of first and second photodetectors on the substrate in a corresponding first and second photodetector array, wherein the first area surrounds the first photodetector array and the second area surrounds the second photodetector array.

13. The method of claim 10, wherein the patterning comprises forming a portion of the flexible and stretchable arm in a spiral shape.

14. The method of claim 10, wherein the patterning comprises forming a portion of the flexible and stretchable arm to have the spiral stretchable portion and the non-stretchable portion.

15. The method of claim 14, wherein the patterning of the stretchable portion of the flexible and stretchable arm comprises forming the stretchable portion into a wave shape that stretches along a direction between the first and second patterned areas.

16. The flexible and stretchable image of claim 1, further comprising:
a carrier configured to support the first rigid substrate, the second rigid substrate, and the flexible and stretchable arm,
wherein the carrier is shaped as a sphere.

17. The flexible and stretchable image of claim 16, wherein the carrier includes a pneumatic inlet configured to supply or remove a fluid inside the carrier to
change a shape of the carrier.

* * * * *